(12) United States Patent
Deng et al.

(10) Patent No.: US 6,301,281 B1
(45) Date of Patent: *Oct. 9, 2001

(54) SEMICONDUCTOR LASER HAVING CO-DOPED DISTRIBUTED BRAGG REFLECTORS

(75) Inventors: Hongyu Deng, San Jose; Xiaozhong Wang; Chun Lei, both of Sunnyvale, all of CA (US)

(73) Assignee: Agilent Technologies, Inc., Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/144,355

(22) Filed: Aug. 31, 1998

(51) Int. Cl.$^7$ ................................. H01S 5/00; H01S 3/08
(52) U.S. Cl. ................................. 372/45; 372/96
(58) Field of Search ................. 372/96, 99, 45, 372/50, 92; 438/32

(56) References Cited

U.S. PATENT DOCUMENTS

| | | | |
|---|---|---|---|
| 4,371,967 | * 2/1983 | Wada et al. | 372/45 |
| 5,018,157 | 5/1991 | Deppe et al. | 372/45 |
| 5,208,820 | 5/1993 | Kurihara | 372/45 |
| 5,351,257 | * 9/1994 | Lebby et al. | 372/45 |
| 5,513,202 | * 4/1996 | Kobayashi et al. | 372/96 |
| 5,547,898 | * 8/1996 | Grodzinski et al. | 438/32 |
| 5,557,627 | * 9/1996 | Schneider, Jr. et al. | 372/45 |
| 5,568,499 | 10/1996 | Lear | 372/45 |
| 5,724,376 | 3/1998 | Kish, Jr. | 372/96 |
| 5,949,807 | * 9/1999 | Fujimoto et al. | 372/45 |

FOREIGN PATENT DOCUMENTS

| | | |
|---|---|---|
| 0495301A1 | 7/1992 | (EP) . |
| 2333895A | 8/1999 | (GB) . |
| 56-088388 | * 7/1981 | (JP) . |
| 09-097945 | * 4/1997 | (JP) . |
| 09-260770 | * 10/1997 | (JP) . |

OTHER PUBLICATIONS

"Low Series Resistance High–Efficiency GaAs/AlGaAs Vertical–Cavity Surface–Emitting Lasers with Continuously Graded Mirrors Grown by MOCVD"; by P. Zhou, Julian Cheng, C.F. Schaus, S. Z.. Sun, K. Zheng, E.. Armour, C. Hains, Wei Hsin, D. R. Myers, and G. A. Vawter; by IEEE Photonics Technology Letters, vol. 3., No. 7., Jul. 1991, (pp. 591–593).

"Low Threshold Voltage Vertical Cavity Surface–Emitting Laser"; by K. L.. Lear, S. A. Chalmers and K. P. Killeen; by Electronics Letters, Apr. 1, 1993, vol. 29, No. 7, (pp. 584–586).

* cited by examiner

*Primary Examiner*—Quyen Leung

(57) ABSTRACT

This invention provides a semiconductor laser device, such as a Vertical Cavity Surface-Emitting Laser (VCSEL) device which includes a Distributed Bragg Reflector (DBR) made up of layers which are co-doped with different dopants. For instance, a p-type DBR produced by organometallic vapor-phase epitaxy (OMPVE) includes layers having, respectively, a low refractive index and a high refractive index, the layers being made, respectively, of high-Al AlGaAs and low-Al AlGaAs. According to the invention, C, by itself or in addition to Mg, is used as the dopant in the high-Al AlGaAs layers, and Mg is used in the low-Al AlGaAs layers. Because of this co-doping, the semiconductor laser device achieves low series resistance and operating voltage, with good manufacturability.

10 Claims, 3 Drawing Sheets

SEMICONDUCTOR LASER HAVING CO-DOPED DISTRIBUTED BRAGG REFLECTORS

FIELD OF THE INVENTION

The invention generally relates to the field of semiconductor devices and their fabrication. More specifically, the invention relates to light-emitting devices, such as semiconductor laser devices. The invention has particular applicability to Vertical Cavity Surface-Emitting Laser (VCSEL) devices.

BACKGROUND OF THE INVENTION

A semiconductor laser device, such as a Vertical Cavity Surface-Emitting Laser (VCSEL) device, produces monochromatic, coherent light when electrical current passes through it. Essentially, a VCSEL is made up of a layer of light-emitting material sandwiched between two reflective layers.

Heat dissipation is one of the challenges with which VCSEL designers must deal. The amount of heat generated is related to the resistance of the VCSEL, and to the amount of current the VCSEL carries. The resistance is commonly called "series resistance," because the current flows through the layers in series. While it is desirable that the VCSEL be able to maximize the power output of the laser light by carrying as much current as possible, the heating limits the amount of current that can be carried.

Conventional approaches have been used to reduce the heat dissipation efficiency of the VCSEL structure. For instance, Kish, Jr., et al., U.S. Pat. No. 5,724,376, "Transparent Substrate Vertical Cavity Surface Emitting Lasers Fabricated by Semiconductor Wafer Bonding," referred to below in connection with FIG. 1, describes a structure which employs a heat sink in proximity to the active layer.

It is also known that the resistance of the layers making up the reflective structures can be reduced by doping. This allows more current to flow, for a given amount of heating, so the light power output is increased. See, for instance, K. L. Lear et al., "Low Threshold Voltage Vertical Cavity Surface-Emitting Laser," Electronics Letters, Vol. 29, No. 7, (Apr. 1, 1993), pp. 584–6.

Also, in P. Zhou et al., "Low Series Resistance High-Efficiency GaAs/AlGaAs Vertical-Cavity Surface-Emitting Lasers with Continuously Graded Mirrors Grown by MOCVD", IEEE Photonics Technology Letters, Vol. 3, No. 7 (July 1991), a technique is described for reducing series resistance by grading interfaces between reflector layers.

However, there remains a need for additional new VCSEL structures, which further improve current-carrying capacity while limiting resistance, and which provide good manufacturability.

SUMMARY OF THE INVENTION

There is provided, in accordance with the invention, a semiconductor laser device which has a low series resistance and which is easily manufacturable.

Such a semiconductor laser device comprises an active layer and first and second reflective structures disposed on opposing sides of the active layer. Each of the first and second reflective structures are DBRs, and each DBR includes, respectively, (i) a first layer having a first index of refraction, and (ii) a second layer having a second index of refraction.

The two DBRs are doped, one p-type and the other n-type. While, for each DBR, the doping type is consistent, different dopants are used for the different layers of a given DBR.

In a preferred embodiment, the reflective structures are DBRs made of AlGaAs, where the Al content is varied, to vary the refractive index of the layers. Preferably, the two layers of the p-type DBR are doped with magnesium and carbon for the low- and high-refractive-index layers, respectively.

DETAILED DESCRIPTION OF THE PREFERRED EMBODIMENTS

This invention provides a co-doping process developed to prepare p-type DBRs by organometallic vapor-phase epitaxy (OMPVE) for semiconductor VCSELs. By using this co-doping process, low series resistance and operating voltage can be achieved by these devices, with good manufacturability.

Figure 1:
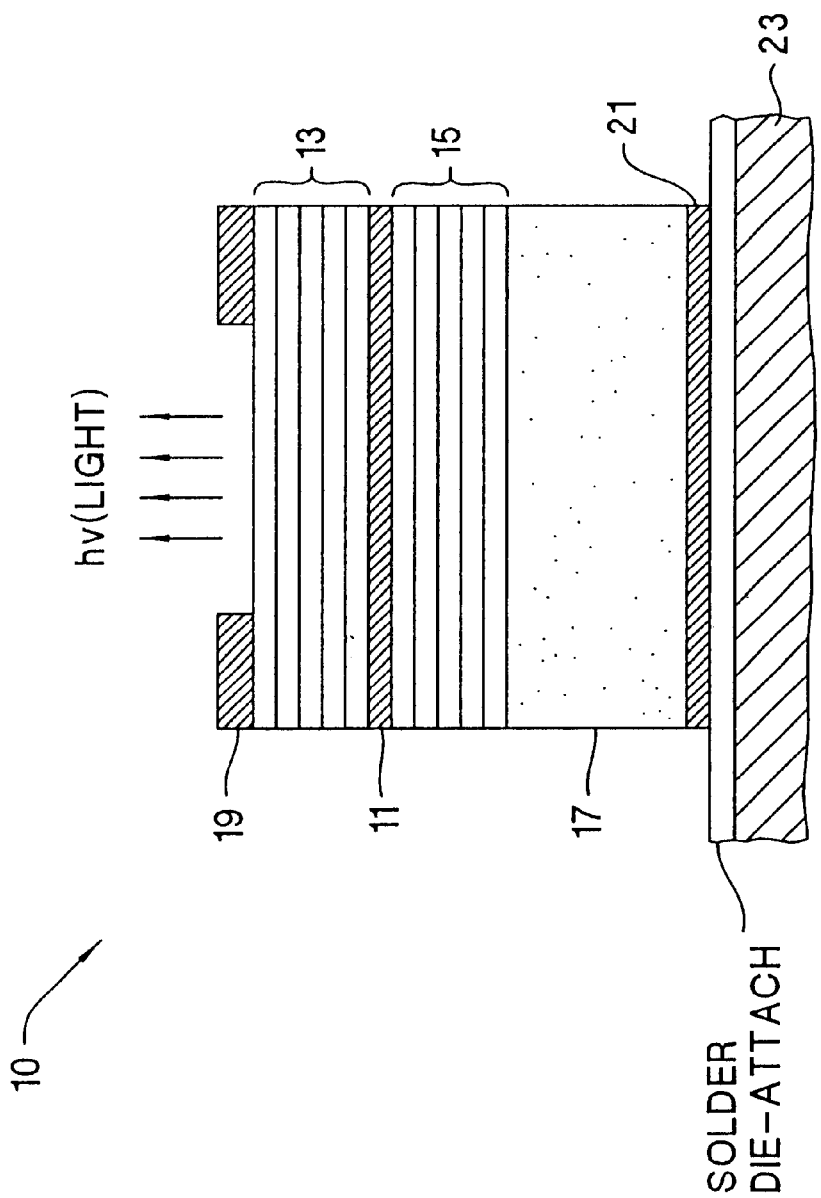
FIG. 1 is a schematic diagram of a conventional semiconductor laser device.

FIG. 1—A Conventional VCSEL

An example of a conventional VCSEL, generally designated 10, is shown in FIG. 1. The VCSEL of FIG. 1 is described in Kish, Jr., et al., U.S. Pat. No. 5,724,376, "Transparent Substrate Vertical Cavity Surface Emitting Lasers Fabricated by Semiconductor Wafer Bonding," discussed in more detail below. FIG. 1 of the Kish patent is duplicated as FIG. 1 of the present patent application.

In a semiconductor laser such as the VCSEL 10, a layer 11 of material which emits light when current flows through it is used as the active material. Various materials having this light-emitting property are known to persons skilled in the art.

The opposing reflecting surfaces are fabricated above and below the active layer. An upper reflecting structure 13 and a lower reflecting structure 15 are shown. The active layer 11 is between the reflecting structures 13 and 15. The reflective surfaces 13 and 15 typically are produced by depositing a sequence of layers of material having different indices of refraction. Such a structure is called a Distributed Bragg Reflector (DBR). The space between the DBRs (occupied by the active layer 11) is called a Fabry-Perot cavity.

The structure just described is formed on a substrate 17.

In VCSEL design, it is common practice to dope the two reflecting structures 13 and 15 in opposite fashion. That is, one of the reflecting structures is doped n-type, and the other is doped p-type. Thus, a VCSEL can have characteristics comparable to those of a pn-junction diode. A circuit employing a VCSEL drives the VCSEL, to produce light, by applying a forward bias voltage between the two terminals of the VCSEL.

There are known ways of setting the refractive index of a layer of semiconductor material. For instance, if the layers are made of aluminum gallium arsenide (AlGaAs), then the aluminum content may be varied: the higher the aluminum content, the lower the refractive index.

As per common practice, the layers may be doped to make them n-type or p-type. For instance, carbon (C) or magnesium (Mg) dopants may be used to make AlGaAs p-type.

Electrical contacts 19 and 21 are provided on opposite sides of the above-described semiconductor structure, to allow current to be applied to the structure to activate the active layer 11. The upper contact 19 is configured to provide clearance for the laser light to emerge from the VCSEL device 10. In one possible configuration, shown schematically in FIG. 1, the upper contact 19 has an aperture, through which the laser light passes. In FIG. 1, the laser light is shown as going upward, through the aperture in the upper contact 19.

A VCSEL device, such as the VCSEL 10, has a characteristic resistance between the contacts 19 and 21. As current flows through the VCSEL 10, heat is generated. The heat is dissipated by a heat sink 23 attached with a solder-die.

Figure 2:
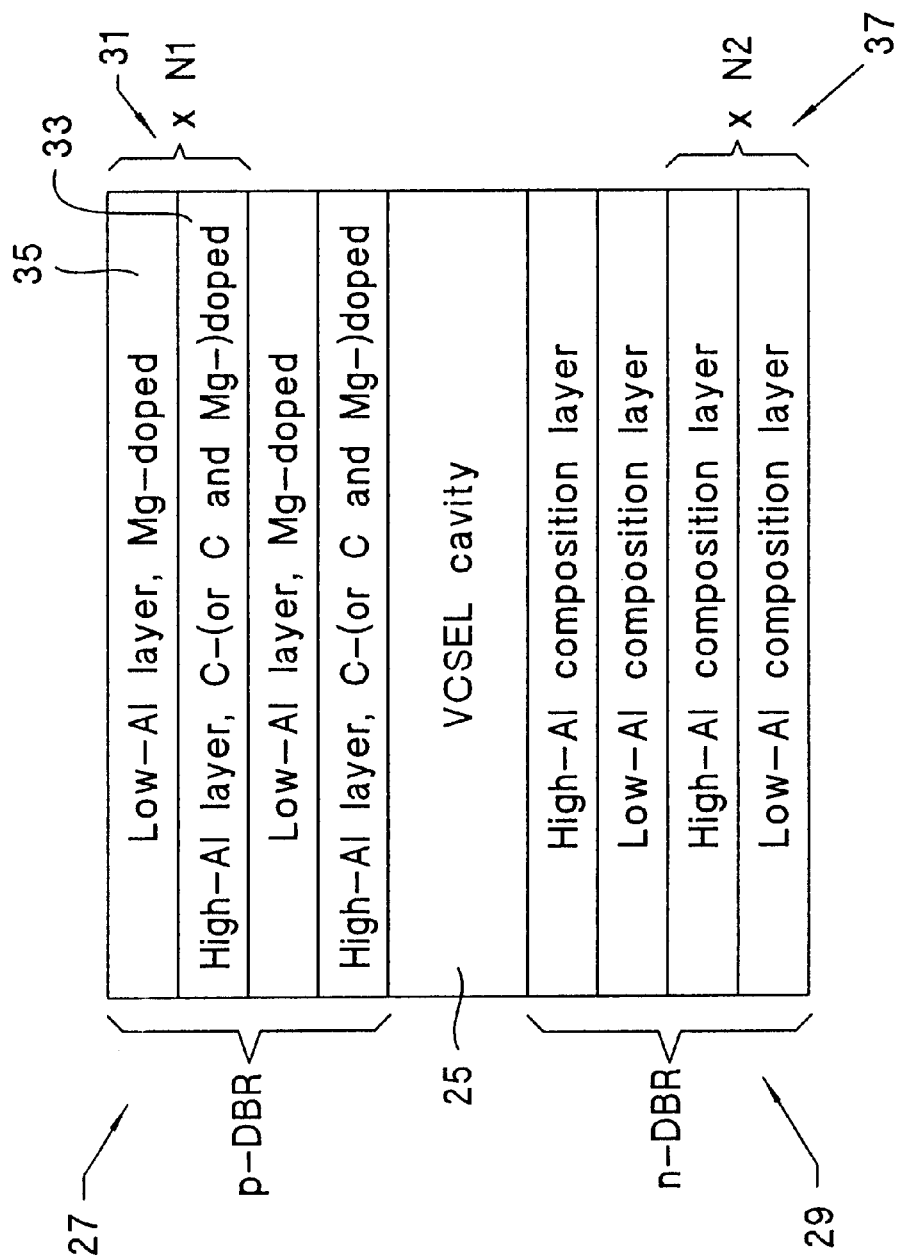
FIG. 2 is a schematic diagram of a semiconductor laser device according to a first embodiment of the invention.

FIG. 2—Structural Embodiment of the Invention

FIG. 2 is a schematic diagram of a portion of a VCSEL device according to the invention. The structure shown in FIG. 2 corresponds with the structures 11, 13, and 15 of FIG. 1. The remainder of FIG. 1 includes elements not essential to the invention. Therefore, these additional elements have been omitted from FIG. 2.

An active layer 25, similar to the active layer 11 of FIG. 1, forms a VCSEL cavity between two reflective structures 27 and 29. The reflective structures 27 and 29 are shown as a p-type DBR and an n-type DBR, respectively.

The DBRs 27 and 29 include alternating layers of two materials with different refractive indices. As discussed above, where the materials are AlGaAs, a low Al composition AlGaAs layer serves as the high index material, and a high Al composition AlGaAs as the low index material. A graded interface in between the layers, not shown, may be used if suitable.

A pair of layers within a DBR may be thought of as a unit substructure. Then, a DBR may be constructed, including a suitable number of substructures. In FIG. 2, the p-type DBR 27 includes a unit substructure 31, including a lower-effective-index layer 33 and a high-refractive-index layer 35.

While one such unit substructure per DBR is a theoretical minimum, in practice DBRs include more than one unit substructure. As shown, the unit substructure is repeated N1 number of times to form the entire p-type DBR 27. Similarly, the n-type DBR 29 includes a unit substructure 37, which is repeated N2 number of times N1 and N2 are integers representing the total number of unit substructures. For preferred embodiments, N1 and N2 can be as great as approximately 50.

Doping

The electrical pump current, which passes through all of the layers, in series, generates heat in relation to the total resistance of the structure. In accordance with the invention, sufficient doping in those layers and the interface is employed in order to reduce the overall resistance. Accordingly, the voltage drop across the DBRs 27 and 29, and the heat generated by the current flow, are advantageously reduced. A p-type DBR tends to have higher resistance than an n-type DBR. Accordingly, the invention is particularly advantageous as applied to p-type DBRs.

In accordance with the invention, a "co-doping" scheme uses different dopants for the two layers in a DBR, or DBR unit substructure.

The structure of FIG. 2 includes DBRs made of a preferred material, AlGaAs, in which the index of refraction is varied by varying the Al content. Two of the commonly used dopants in p-type AlGaAs DBRs are Mg and C. For the p-type DBR 27, C is used as the dopant in the high-Al AlGaAs layers, such as the layer 33, and Mg is used in the low-Al AlGaAs layers, such as the layer 35.

Note, by the way, that for other preferred embodiments of the invention, the high-Al AlGaAs layers (e.g., the layer 33) may be doped with a combination of C and Mg, as well as just with C.

Manufacturability—Preferred Doping

Mg may be used as a dopant, regardless of the aluminum content of the AlGaAs material. Mg doping by OMPVE is performed through the use of known Mg dopant sources.

However, for high Al composition AlGaAs and interface layers, Mg has the drawback that its highest possible activated dopant ion concentration (that is, carrier concentration achievable) is limited to a disadvantageously low value of $10^{18}$ dopant atoms per $cm^3$. As a result, VCSELs grown using Mg-doped p-type DBRs usually have higher operating voltages because of their higher series resistances.

Carbon, on the other hand, can be readily incorporated into AlGaAs layers at very high levels. However, carbon dopant OMPVE gases tend to have disadvantageous corrosive properties. In a fabrication process which includes a step of doping from an ambient carbon dopant source gas, the carbon dopant source gas back-etches the AlGaAs layers upon which the carbon-doped epitaxial is to be deposited.

If a $CBr_4$ dopant gas is used with low-Al AlGaAs, back-etching occurs at a rate over 30% of the normal growth rate. The back-etch rate, however, is negligible for AlAs. For intermediate formulations including both Al and Ga, the back-etch rates also are intermediate. In addition, the back-etch rate is sensitive to temperature and to gas flow pattern variation across the wafer.

As a result, the thickness distribution of a C-doped p-type DBR across the wafer tends not to be uniform. By contrast, the fabrication of n-type DBR structures does not employ substances which cause back-etching. Therefore, n-type DBR fabrication is easily controlled, while p-type DBR fabrication has uniformity problems leading to DBR thickness mismatches.

In a conventional VCSEL where n-type and p-type DBRs are both needed, the thickness mismatch between them significantly degrades the performance uniformity of devices across the wafer.

In accordance with the invention, however, better uniformity is achieved by using carbon doping only for layers of material which are high in aluminum content, and thus less susceptible to back-etching and the resultant uniformity problems. Carbon doping is better-suited for high-Al-content, low-refractive-index AlGaAs layers, than for low-Al-content, high-refractive-index AlGaAs layers.

For the more back-etch-susceptible low-Al-content layers, Mg doping is not subject to the same limitation of $1 \times 10^{18}$ per $cm^3$ for high-Al-content material. This way, high doping concentrations in excess of $3 \times 10^{18}$ $cm^{-3}$ in both layers can be easily achieved without the problems of back-etch. Therefore, Mg doping of low-Al-content layers provides a resistance which is advantageously low, in the overall context of the structure, and manufacturability without back-etching and the resultant nonuniformity.

While one preferred embodiment of the invention employs only carbon for doping of the high-Al-content layers, it is also possible to dope with a mixture of Mg and C. Because the Al content is high, the carbon content of dopant gas does not cause a disadvantageous amount of back-etching.

Interface Layers; Different Doping of Sections

The embodiment of FIG. 2, and the related embodiments which a skilled person will recognize from the description given above, may be thought of as a first class of embodiments.

There are also two additional classes of embodiments ("second" and "third" classes). The second class also includes relatively narrow interface layers between the VCSEL cavity and the layers previously described, adjacent to or in between those layers. To distinguish between these types of layers, the term "normal" layers will be used to refer to the layers described above.

Interface layers smooth out the sharp transition in composition from the high-Al layer to the low-Al layer. This advantageously reduces the series resistance.

Generally, the interface layers need to be doped heavily in order to reduce the series resistance sufficiently. A co-doping design (C+Mg, or C alone) in this interface layer advantageously achieves this reduction in resistance.

In the third class of embodiments, layers are divided into sections, with some continuously changing or discrete Al compositions, and/or co-doping of the different sections. This may be done with the normal layers. The interface grading layers can also be divided into sections and co-doped accordingly.

Sectionalized co-doping has been found to be particularly effective where interface layers are provided. A preferred sectionalized interface includes interface layers of AlGaAs interfaced between normal layers. The interface layer or layers are co-doped as per their sections.

Sectional co-doping can be done in many varied ways. For example, an interface layer may have two sections, only one of which is co-doped.

Where high-Al and low-Al normal layers each have interface layers, the interface after the high-Al layer, but not the interface after the low-Al layer, can be co-doped. Additionally, in this layer configuration the two normal layers themselves may or may not be co-doped.

Figure 3:
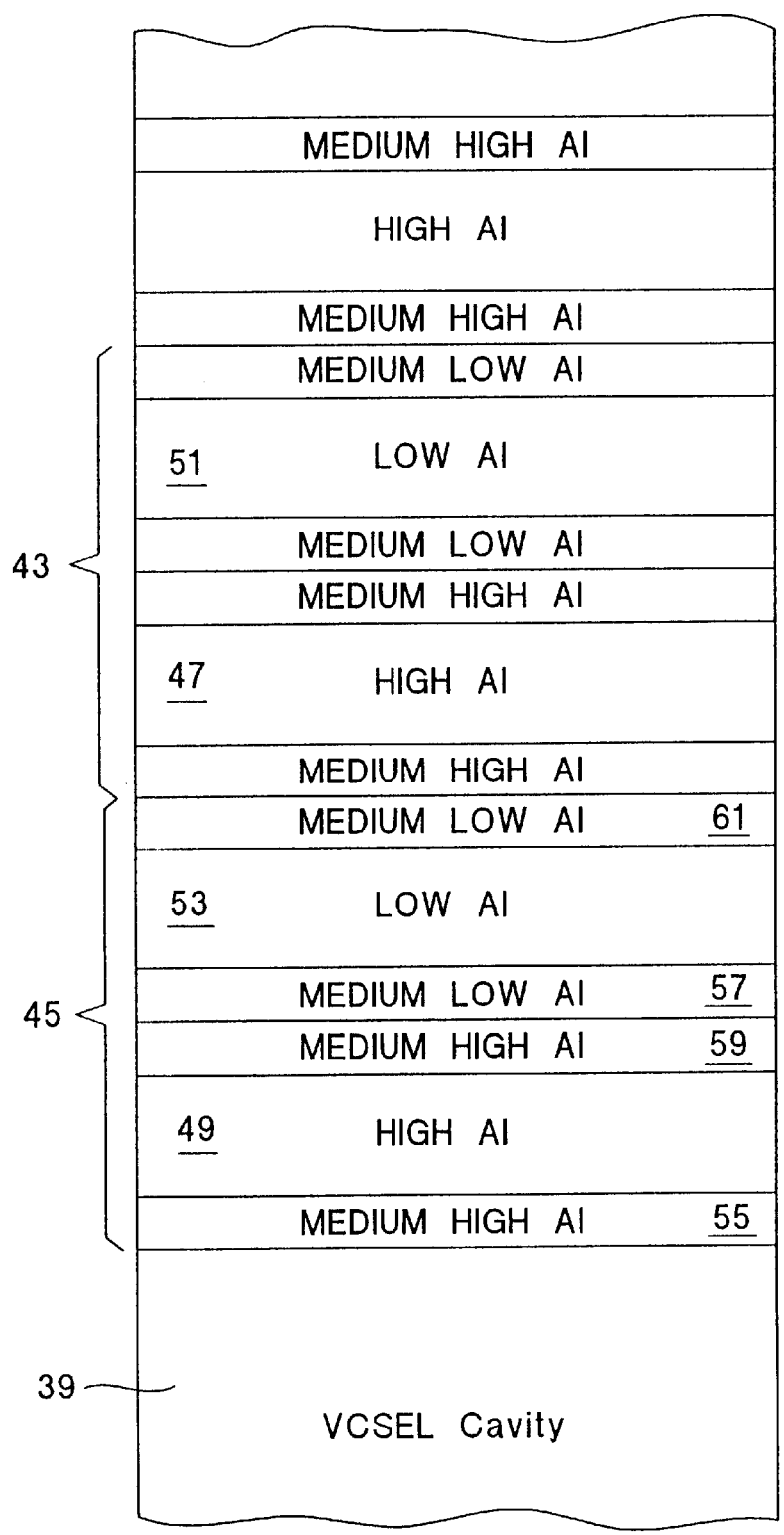
FIG. 3 is a schematic diagram of a semiconductor laser device according to second and third embodiments of the invention.

FIG. 3 is a cross-sectional diagram which shows the p-type DBR of one example of a semiconductor laser device. The device of FIG. 3 has interface layers in accordance with the second class of embodiments, and in which the interface layers show an example of sectionalized co-doping in accordance with the third class of embodiments.

In FIG. 3, a VCSEL cavity 39 and a p-DBR, generally shown as 41, are given. For simplicity, two unit substructures 43 and 45 are shown, although there may be more unit substructures. The unit substructures 43 and 45 each include a high-Al normal layer (47 and 49, respectively) and a low-Al normal layer (51 and 53, respectively).

Interfaces between normal layers and/or the VCSEL cavity 39 illustrate the second and third embodiments of the invention. Individual examples will be discussed separately.

In accordance with the second class of embodiments, an interface layer 55 is shown between the VCSEL cavity 39 and the high-Al normal layer 49.

In accordance with the third class of embodiments, an interface made up of sections 57 and 59 is shown between the high-Al normal layer 49 and the low-Al normal layer 53. In the discussion which follows, layers such as 57 and 59 will be referred to either as individual interface layers which abut each other, or as sections of an overall interface layer. Which nomenclature is which will be clear from the context.

As shown, the interface layers 55, 57, and 59 are thinner than the normal layers 53 and 49. As described above, this relative thinness of the interface layers, such as 55, 57, and 59, is a preferred feature.

Also, the interface layers have legends reflective of their relative Al content. The Al content legends shall be understood to have their intuitive meanings, that is, running from low-Al (that is, the lowest Al content) through medium low Al and medium high Al to high-Al (that is, the highest Al content).

The exact Al compositions of the may vary with the particular application, but preferred embodiments of the invention's second and third classes of embodiments have layers whose Al content are intermediate in value between the Al contents of the adjoining interface or normal layers. For instance, successively adjoining layers run from 49 (high Al) through 59 (medium-high Al) and 57 (medium low Al) to 53 (low Al).

The structure of FIG. 3, taken as a whole, shows a preferred way in which interface layers are incorporated into an overall p-DBR structure. That is, each of the normal layers has an interface layer on either side.

Consider in detail, for instance, the substructure 45. The interface layers 55 and 57 abut the high-Al normal layer 49 on either side. The interface layers 55 and 57 each have medium-high Al content, so that the Al content varies relatively modestly as a layer boundary is crossed. Also, the low-Al normal layer 53 abuts, on either side, the interface layer 57 and an interface layer 61. The interface layers 57 and 61 have medium low Al content, so again, crossing these layer boundaries does not drastically vary the Al content. Also, the 57–59 boundary varies the Al content only from medium low to medium high.

Co-doping of the interface layers is also made in accordance with the invention. For instance, depending on the absolute Al content of the various interface layers, the medium low-Al content interface layers 57 and 61 might be doped with Mg, while the medium high-Al content interface layers 55 and 59 might be doped with C, or with C+Mg.

CONCLUSION

In accordance with the invention, therefore, the conflicting needs for a well-doped DBR structure for minimizing series resistance and for a device whose fabrication avoids back-etching problems are resolved. VCSELs with co-coped DBRs are expected to have low series resistance and operating voltage, with relatively good across-wafer uniformity.

What is claimed is:

1. A semiconductor laser device comprising:
    an active layer having opposing sides;
    a first reflective structure disposed on one side of the active layer, the first reflective structure including,
    a first layer, having a first index of refraction, being made of a first semiconductor compound including a first dopant, and
    a second layer, having a second index of refraction, being made of a second semiconductor compound including a second dopant, the second dopant being different from the first dopant; and
    a second reflective structure disposed on the side of the active layer opposite to one side, the second reflective structure including,
    a first layer, having a first index of refraction and being made of a first semiconductor compound including a first dopant, and
    a second layer, having a second index of refraction and being made of a second semiconductor compound including a second dopant, the second dopant being different from the first dopant.

2. A semiconductor laser device as recited in claim 1, wherein, for each of the first and second reflective structures:
    the first layer is made of a first III–V semiconductor compound; and
    the second layer is made of a second III–V semiconductor compound.

3. A semiconductor laser device as recited in claim 2, wherein:
    the first III–V semiconductor compound is AlGaAs having a first Al composition; and the second III–V semiconductor compound is AlGaAs having a second Al composition which is less than the first Al composition.

4. A semiconductor laser device as recited in claim 1, wherein each of the first and second reflective structures further includes, respectively, (i) a third layer having the first index of refraction and being made of the first semiconductor compound including the first dopant, and (ii) a fourth layer having the second index of refraction and being made of the second semiconductor compound including the second dopant.

5. A semiconductor laser device comprising:

an active layer having opposing sides; and a first reflective structure disposed on one side of the active layer, the first reflective structure including (i) a first layer, having a first index of refraction and being made of a first III–V semiconductor compound, wherein the first layer is doped with a first dopant from the group consisting of a) carbon and b) carbon and magnesium, and (ii) a second layer, having a second index of refraction and being made of a second III–V semiconductor compound, wherein the second layer is doped with a magnesium dopant;

a second reflective structure disposed on the side of the active layer opposite to the one side, the second reflective structure including (i) a first layer, having a first index of refraction and being made of a first III–V semiconductor compound, wherein the first layer is doped with a dopant from the group consisting of (a) carbon and (b) carbon and magnesium, and (ii) a second layer, having a second index of refraction and being made of a second III–V semiconductor compound, wherein the second layer is doped with a magnesium dopant.

6. A semiconductor laser device as recited in claim 5, wherein each of the first and second reflective structures further includes, respectively, (i) a third layer having the first index of refraction and being made of the first III–V semiconductor compound including the first dopant, and (ii) a fourth layer having the second index of refraction and being made of the second III–V semiconductor compound including the magnesium dopant.

7. A semiconductor laser device as recited in claim 5, further comprising an interface layer adjacent to one of the first layer and the second layer.

8. A semiconductor laser device as recited in claim 7, wherein the interface layer has a first section and a second section, the first and second sections having different chemical makeup.

9. A semiconductor laser device as recited in claim 5, wherein one of the first and second layers has a first section and a second section, the first and second sections having different chemical makeup.

10. A semiconductor laser device comprising:

an active layer having opposing sides;

a first reflective structure disposed on one side of the active layer, the first reflective structure including,
  (i) a first layer having a first index of refraction and being doped with a first dopant selected from a group consisting of (a) carbon and (b) carbon and magnesium, and
  (ii) a second layer having a second index of refraction and being doped with a magnesium dopant; and a second reflective structure disposed on the side of the active layer opposite to the one side, the second reflective structure including,
  (i) a first layer, having a first index of refraction and being doped with a dopant selected from the group consisting of (a) carbon and (b) carbon and magnesium, and
  a second layer, having a second index of refraction and being doped with a magnesium dopant;

wherein, for each of the first and second reflective structures, the first layer is made of a first III–V semiconductor compound; and the second layer is made of a second III-V semiconductor compound.

* * * * *